United States Patent
Zhou

(10) Patent No.: US 9,570,885 B2
(45) Date of Patent: Feb. 14, 2017

(54) LASER, PASSIVE OPTICAL NETWORK SYSTEM, APPARATUS AND WAVELENGTH CONTROL METHOD

(71) Applicant: Huawei Technologies Co., Ltd., Shenzhen, Guangdong (CN)

(72) Inventor: Xiaoping Zhou, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 274 days.

(21) Appl. No.: 14/308,335

(22) Filed: Jun. 18, 2014

(65) Prior Publication Data

US 2016/0204577 A1 Jul. 14, 2016

Related U.S. Application Data

(63) Continuation of application No. PCT/CN2011/084295, filed on Dec. 20, 2011.

(51) Int. Cl.
*H04B 10/572* (2013.01)
*H04B 10/50* (2013.01)
(Continued)

(52) U.S. Cl.
CPC ......... *H01S 5/06251* (2013.01); *H04B 10/503* (2013.01); *H04B 10/5563* (2013.01);
(Continued)

(58) Field of Classification Search
CPC . H04B 10/675; H04B 10/548; G02B 6/29317; H01S 5/0085
(Continued)

(56) References Cited

U.S. PATENT DOCUMENTS 4,561,119 A * 12/1985 Epworth .............. H04B 10/675
372/26
5,119,393 A * 6/1992 Oka ....................... B82Y 20/00
372/102

(Continued)

FOREIGN PATENT DOCUMENTS

CN 1701478 A 11/2005
CN 1838492 A 9/2006
(Continued)

OTHER PUBLICATIONS

Talneau, et al., "Constant Output Power and Low Linewidth in a Simple Wide-Tuning DFB Laser with Multiwavelength Grating," IEEE Journal of Selected Topics in Quantum Electronics, vol. 3, No. 2, pp. 628-631, Institute of Electrical and Electronics Engineers, New York, New York (Apr. 1997).

(Continued)

*Primary Examiner* — Oommen Jacob
(74) *Attorney, Agent, or Firm* — Leydig, Voit & Mayer, Ltd.

(57) ABSTRACT

The present invention provide a laser, where the laser is divided into a laser region and a grating adjustment region through a first electrical isolation layer; the laser region is configured to generate optical signals, where the optical signals include an optical signal with a wavelength corresponding to a "0" signal and an optical signal with a wavelength corresponding to a "1" signal; the grating adjustment region is configured to adjust a wavelength of the grating adjustment region by controlling current of the grating adjustment region, so that the optical signal with the wavelength corresponding to the "1" signal of the laser region passes through the grating adjustment region, and the optical signal with the wavelength corresponding to the "0" signal of the laser region returns to the laser region, thereby (Continued)

implementing suppression to chirp of a directly modulated laser.

10 Claims, 4 Drawing Sheets

(51) Int. Cl.
*H01S 5/00* (2006.01)
*H01S 5/20* (2006.01)
*H01S 5/22* (2006.01)
*H01S 5/0625* (2006.01)
*H04B 10/556* (2013.01)
*H01S 5/12* (2006.01)
*H01S 5/323* (2006.01)

(52) U.S. Cl.
CPC ........ *H04B 10/572* (2013.01); *H01S 5/06256* (2013.01); *H01S 5/12* (2013.01); *H01S 5/22* (2013.01); *H01S 5/32333* (2013.01)

(58) Field of Classification Search
USPC ........................................ 398/168, 182, 183
See application file for complete search history.

(56) References Cited

U.S. PATENT DOCUMENTS

| | | | | |
|---|---|---|---|---|
| 5,325,382 A * | 6/1994 | Emura | ................ | H01S 5/06256 372/26 |
| 5,757,832 A * | 5/1998 | Uchida | ................ | B82Y 20/00 372/106 |
| 5,982,963 A | 11/1999 | Feng et al. | | |
| 6,104,851 A * | 8/2000 | Mahgerefteh | ...... | G02B 6/29317 385/24 |
| 6,155,699 A * | 12/2000 | Miller | ..................... | H01L 33/46 257/95 |
| 6,331,991 B1 * | 12/2001 | Mahgerefteh | ....... | H01S 5/06213 372/25 |
| 7,139,299 B2 * | 11/2006 | Ungar | ..................... | H01S 5/026 372/50.1 |
| 7,505,694 B2 * | 3/2009 | Johnson | ............... | H04B 10/504 398/193 |
| 7,564,889 B2 * | 7/2009 | Matsui | ................... | H04B 10/25 372/102 |
| 7,778,552 B2 * | 8/2010 | Deng | ................... | H04B 10/504 372/102 |
| 7,809,280 B2 * | 10/2010 | Mahgerefteh | .... | H04B 10/25137 398/183 |
| 7,907,648 B2 * | 3/2011 | Matsui | ................ | H01S 5/06258 372/102 |
| 8,073,342 B2 * | 12/2011 | Caplan | ................. | H04B 10/504 398/201 |
| 8,131,157 B2 * | 3/2012 | Heismann | ........ | H04B 10/25137 398/192 |
| 9,231,367 B2 * | 1/2016 | Matsui | ................... | H01S 5/0265 |
| 2004/0264535 A1 * | 12/2004 | Svenson | ............... | H01S 5/0265 372/50.1 |
| 2005/0111852 A1 * | 5/2005 | Mahgerefteh | .......... | G02B 5/281 398/187 |
| 2006/0209911 A1 * | 9/2006 | Takabayashi | ....... | H01S 5/06256 372/20 |
| 2008/0166129 A1 * | 7/2008 | Luo | ..................... | H04J 14/0226 398/87 |
| 2010/0172650 A1 | 7/2010 | Deng et al. | | |
| 2010/0265980 A1 * | 10/2010 | Matsuda | ................ | B82Y 20/00 372/46.01 |
| 2011/0134957 A1 * | 6/2011 | Su | ......................... | H01S 5/0265 372/50.22 |

FOREIGN PATENT DOCUMENTS

| | | |
|---|---|---|
| CN | 101416426 A | 4/2009 |
| EP | 0287065 A2 | 10/1988 |
| EP | 1610426 A1 | 12/2005 |
| EP | 2169788 A1 | 3/2010 |

OTHER PUBLICATIONS

Oberg et al., "74 nm Wavelength Tuning Range of an InGaAsP/InP Vertical Grating Assisted Codirectional Coupler Laser with Rear Sampled Grating Reflector," IEEE Photonics Technology Letters, vol. 5, No. 7, pp. 735-738, Institute of Electrical and Electronics Engineers, New York, New York (Jul. 1993).

Luo et al., "80 km Transmission at 10 Gbps using a Directly-Modulated Miniature Planar-External-Cavity (PLANEX) Laser," The 18$^{th}$ Annual Meeting of the IEEE Lasers and Electro-Optics Society, pp. 337-338, Institute of Electrical and Electronics Engineers, New York, New York (Oct. 22, 2005).

Sarlet et al., "Control of Widely Tunable SSG-DBR Lasers for Dense Wavelength Division Multiplexing," Journal of Lightwave Technology, vol. 18, No. 8, pp. 1128-1138, Institute of Electrical and Electronics Engineers, New York, New York (Aug. 2000).

* cited by examiner

LASER, PASSIVE OPTICAL NETWORK SYSTEM, APPARATUS AND WAVELENGTH CONTROL METHOD

CROSS-REFERENCE TO RELATED APPLICATIONS

This application is a continuation of International Patent Application No. PCT/CN2011/084295, filed on Dec. 20, 2011, which is hereby incorporated by reference in its entirety.

FIELD OF THE INVENTION

The present invention relates to the field of optical fiber communications, and in particular, to a laser, a passive optical network system, an apparatus, and a wavelength control method.

BACKGROUND OF THE INVENTION

The optical fiber communication is a main transmission means of a modern communication network; the optical fiber communication is that: At a sending end, transferred information is firstly converted into an electric signal, and then modulated onto a laser beam emitted by a laser, so that intensity of light changes with an amplitude change of the electric signal, and then sent out through an optical fiber; and at a receiving end, a detector converts an optical signal into the electric signals after receiving the optical signal, and restores the original information after demodulation. A distributed feedback (Distributed Feedback, DFB) laser adopts a distributed diffraction grating to generate single-wavelength output, and has advantages of a relatively simple manufacturing process, a small spectral line width, and so on; and is widely applied in the fields of dense wavelength division multiplexing (Dense Wavelength Division Multiplexing, DWDM) and optical fiber access network.

Output wavelength of the DFB laser is directly related to a grating, therefore, not only a change of outside temperature, but also an increase of current carrier density in the laser leads to a change of a central wavelength of the grating, thereby leading to a change of laser emitting wavelength. When a directly modulated digital signal is exerted on the DFB, because injection current corresponding to a "1" signal is different from injection current corresponding to a "0" signal, different peaks, that is, chirp, appear on an output spectrum after the signal is directly modulated. In the optical fiber, dispersion is a basic feature of the optical fiber, that is, for light with different wavelengths, propagation rates are different in the same optical fiber. Therefore, for the laser with the chirp, because of broadening of pulse, inter-symbol interference appears among the signals after a certain distance of transmission, which severely limits a transmission distance.

In the prior art, in order to suppress the chirp, a narrow band filter is added after the DFB laser, so that the filter filters the "0" optical signal while allowing a signal needed in the DFB laser to pass through, thereby weakening an effect of the dispersion on signal transmission. However, in this solution, because two different components and different materials are used, and because of different requirements for temperature, humidity, stress and so on in different environments, that a wavelength of the optical filter may be aligned with the signal wavelength of the DFB laser at all times cannot be ensured; furthermore, on the other hand, spacing between two peaks of a DFB spectrum is very small and at magnitude of 10 GHz, this requires a pass band of the optical filter to be very thin, which increases difficulty of implementing precise and real-time alignment between the two.

SUMMARY OF THE INVENTION

Embodiments of the present invention provide a laser, which suppresses an effect of chirp on the laser, and improves accuracy of wavelength alignment of the laser.

In order to achieve the foregoing purpose, the embodiments of the present invention adopt the following technical solutions.

A laser includes: a laser region and a grating adjustment region; the laser is divided into the laser region and the grating adjustment region through a first electrical isolation layer;

the laser region is configured to generate optical signals, where the optical signals includes an optical signal with a wavelength corresponding to a "0" signal and an optical signal with a wavelength corresponding to a "1" signal; and the grating adjustment region is configured to adjust a wavelength of the grating adjustment region by controlling current of the grating adjustment region, so that the optical signal with the wavelength corresponding to the "1" signal of the laser region passes through the grating adjustment region, and the optical signal with the wavelength corresponding to the "0" signal of the laser region returns to the laser region.

A passive optical network system includes: an optical line terminal and multiple optical network units; the optical line terminal is connected to the multiple optical network units through an optical distribution network, where the optical network unit and/or the optical line terminal includes a laser, and the laser includes: a laser region and a grating adjustment region; and the laser is divided into the laser region and the grating adjustment region through a first electrical isolation layer;

the laser region is configured to generate optical signals, where the optical signals include an optical signal with a wavelength corresponding to a "0" signal and an optical signal with a wavelength corresponding to a "1" signal;

the grating adjustment region is configured to adjust a wavelength of the grating adjustment region by controlling current of the grating adjustment region, so that the optical signal with the wavelength corresponding to the "1" signal of the laser region passes through the grating adjustment region, and the optical signal with the wavelength corresponding to the "0" signal of the laser region returns to the laser region.

An optical network equipment includes a laser, where the laser includes: a laser region and a grating adjustment region; the laser is divided into the laser region and the grating adjustment region through a first electrical isolation layer;

the laser region is configured to generate optical signals, where the optical signals include an optical signal with a wavelength corresponding to a "0" signal and an optical signal with a wavelength corresponding to a "1" signal;

the grating adjustment region is configured to adjust a wavelength of the grating adjustment region by controlling current of the grating adjustment region, so that the optical signal with the wavelength corresponding to the "1" signal of the laser region passes through the grating adjustment region, and the optical signal with the wavelength corresponding to the "0" signal of the laser region returns to the laser region.

A wavelength control method of a laser, where the laser includes: a laser region and a grating adjustment region; the laser is divided into the laser region and the grating adjustment region through a first electrical isolation layer; the method includes:

generating, by the laser region, an optical signal with a wavelength corresponding to a "0" signal and an optical signal with a wavelength corresponding to a "1" signal; and adjusting, by the grating adjustment region, a wavelength of the grating adjustment region by controlling current of the grating adjustment region, returning the optical signal with the wavelength corresponding to the "0" signal of the laser region to the laser region, and allowing the optical signal with the wavelength corresponding to the "1" signal of the laser region to pass through.

For the laser provided in the embodiments of the present invention, the laser is divided into the laser region and the grating adjustment region through the first electrical isolation layer; the laser region is configured to generate optical signals, and the optical signals include the optical signal with the wavelength corresponding to the "0" signal and the optical signal with the wavelength corresponding to the "1" signal; the grating adjustment region is configured to adjust the wavelength of the grating adjustment region by controlling the current of the grating adjustment region, so that the optical signal with the wavelength corresponding to the "1" signal of the laser passes through the grating adjustment region, and the optical signal with the wavelength corresponding to the "0" of the laser region returns to the laser region, which implements chirp suppression to a directly modulated laser, reduces an effect of dispersion of an optical fiber and increases a transmission distance. Further, in the embodiments of the present invention, in comparison with a traditional laser manufacturing process, manufacturing of a component of the present invention changes the original process very little, and also has no significant change in packaging and test, which does not increase the cost of an existing laser component.

BRIEF DESCRIPTION OF THE DRAWINGS

To illustrate the technical solutions in the embodiments of the present invention or in the prior art more clearly, the following briefly describes accompanying drawings needed for describing the embodiments or the prior art. Obviously, the accompanying drawings in the following descriptions are merely some embodiments of the present invention, and persons of ordinary skill in the art may obtain other drawings from the accompanying drawings without making creative efforts.

DETAILED DESCRIPTION OF THE EMBODIMENTS

The following clearly and completely describes the technical solutions according to the embodiments of the present invention with reference to the accompanying drawings in the embodiments of the present invention. Obviously, the embodiments in the following descriptions are merely part of rather than all of the embodiments of the present invention. All other embodiments obtained by persons of ordinary skill in the art based on the embodiments of the present invention without making creative efforts shall fall within the protection scope of the present invention.

Embodiment 1

Figure 1:
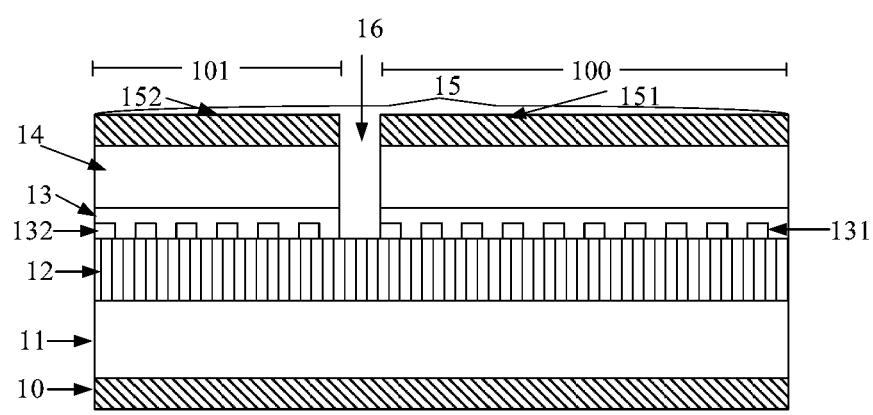
FIG. 1 is a schematic structural diagram of a distributed feedback laser according to an embodiment.

As shown in FIG. 1, in the embodiment of the present invention, a laser is provided, including: a laser region 100 and a grating adjustment region 101, where the laser is divided into the laser region 100 and the grating adjusting region 101 through a first electrical isolation layer 16.

The laser region 100 is configured to generate optical signals, where the optical signals include an optical signal with a wavelength corresponding to a "0" signal and an optical signal with a wavelength corresponding to a "1" signal.

The grating adjustment region 101 is configured to adjust a wavelength of the grating adjustment region by controlling current of the grating adjustment region, so that the optical signal with the wavelength corresponding to the "1" signal of the laser region passes through the grating adjustment region, and the optical signal with the wavelength corresponding to the "0" signal of the laser region returns to the laser region.

Further, the laser region 100 includes: a first current generating unit and a first optical signal generating unit, where the first current generating unit includes: a first electrode sub-layer 151 and a ground electrode 10; first current is generated according to a potential difference between the first electrode sub-layer 151 and the ground electrode 10.

The first optical signal generating unit includes a first grating 131 disposed on a first active layer 12 and located between the first electrode sub-layer 151 and the ground electrode 10; the first current generated by the first current generating unit passes through the first grating 131 and the first active layer 12 to generate the optical signals, and the optical signals include the optical signal with the wavelength corresponding to the "0" signal and the optical signal with the wavelength corresponding to the "1" signal.

The grating adjustment region includes: a second current generating unit and a first optical signal processing unit, where the second current generating unit includes: a second electrode sub-layer 152 and a first side electrode layer and a second side electrode layer which are disposed at two sides of the second electrode sub-layer 152; a potential difference between the second electrode sub-layer 152 and the first side electrode layer generates first current, while a potential difference between the second electrode sub-layer 152 and the second side electrode layer generates second current;

the first optical signal processing unit includes: a second grating 132 disposed on a second active layer 12 (the first active layer is the same as the second active layer, that is, the second active layer shares the first active layer 12); a central wavelength of the second grating 132 is adjusted by controlling the first current and the second current that pass through the second grating 132 and are generated by the second current generating unit, so that the optical signal with the wavelength corresponding to the "1" signal of the laser region passes through the second grating; and the optical signal with the wavelength corresponding to the "0" signal of the laser region returns to the laser region.

Further, the second current generating unit is specifically configured to, when voltage exerted on the first side electrode layer and voltage exerted on the second side electrode layer are both smaller than voltage exerted on the second electrode sub-layer, enable potential differences to be generated both between the second electrode sub-layer and the first side electrode layer and between the second electrode sub-layer and the second side electrode layer.

Further, the second current generating unit is specifically configured to, when voltage exerted on the first side electrode layer and voltage exerted on the second side electrode layer are both negative values, and voltage exerted on the second electrode sub-layer is 0, enable potential differences to be generated both between the second electrode sub-layer and the first side electrode layer and between the second electrode sub-layer and the second side electrode layer.

The first current signal processing unit may control the voltage of the first side electrode layer, the voltage of the second side electrode layer and the voltage of the second electrode sub-layer, so that the current does not enter the first active layer 12 after passing through the second grating, that is, the current flows through the second grating but does not generate laser, and may enable, by adjusting the current that passes through the second grating, the optical signal with the wavelength corresponding to the "1" signal, where the optical signal is generated by the laser region, to pass through the grating adjustment region and the optical signal with the wavelength corresponding to the "0" signal, where the optical signal is generated by the laser region, to return to the laser region.

Further, the laser further includes: the ground electrode layer 10 located at the bottom of the laser, and a semiconductor substrate 11, the active layer 12, a grating layer 13, an upper covering layer 14 and an electrode layer 15 (the electrode layer 15 includes the first electrode sub-layer 151 and the second electrode sub-layer 152) that are disposed on the ground electrode layer in sequence; the laser further includes the first electrical isolation layer 16, where the first electrical isolation layer 16 divides the laser into the laser region 100 and the grating adjustment region 101.

The laser region 100 and the grating adjustment region 101 are the same in grating structure, are made on the same semiconductor substrate 11, and have the same active layer 12. A central wavelength of the grating adjustment region 101 is aligned with the wavelength corresponding to the "0" signal of the laser region, thereby suppressing an output optical signal generated by the injection current corresponding to the "0" signal but normally passing output optical signal generated by the injection current corresponding to the "1" signal.

In the laser, current is injected into both the "0" signal and the "1" signal, and is larger than threshold current. In order to ensure that the wavelength of the grating adjustment region is aligned with the wavelength of the "0" signal, current with equal density also must be injected into the grating adjustment region. This part of current is prevented from entering the active layer below the grating, so as to avoiding generating lasing to affect an filtering effect.

The laser provided in the embodiment of the present invention forms the laser region and the grating adjustment region by changing laser structure, where the wavelength of the grating adjustment region is aligned with the wavelength of the "0" signal, so that the optical signal with the wavelength corresponding to the "1" signal, where the optical signal is generated by the laser region, passes through the grating adjustment region, thereby implementing suppression of the laser to chirp and increasing a transmission distance. At the same time, a manufacturing process of the distributed feedback laser is not changed, so that the manufacturing process is not increased while the laser implements filtering.

Embodiment 2

Further, the laser may be a distributed feedback (Distributed Feedback, DFB) laser.

Figure 2:
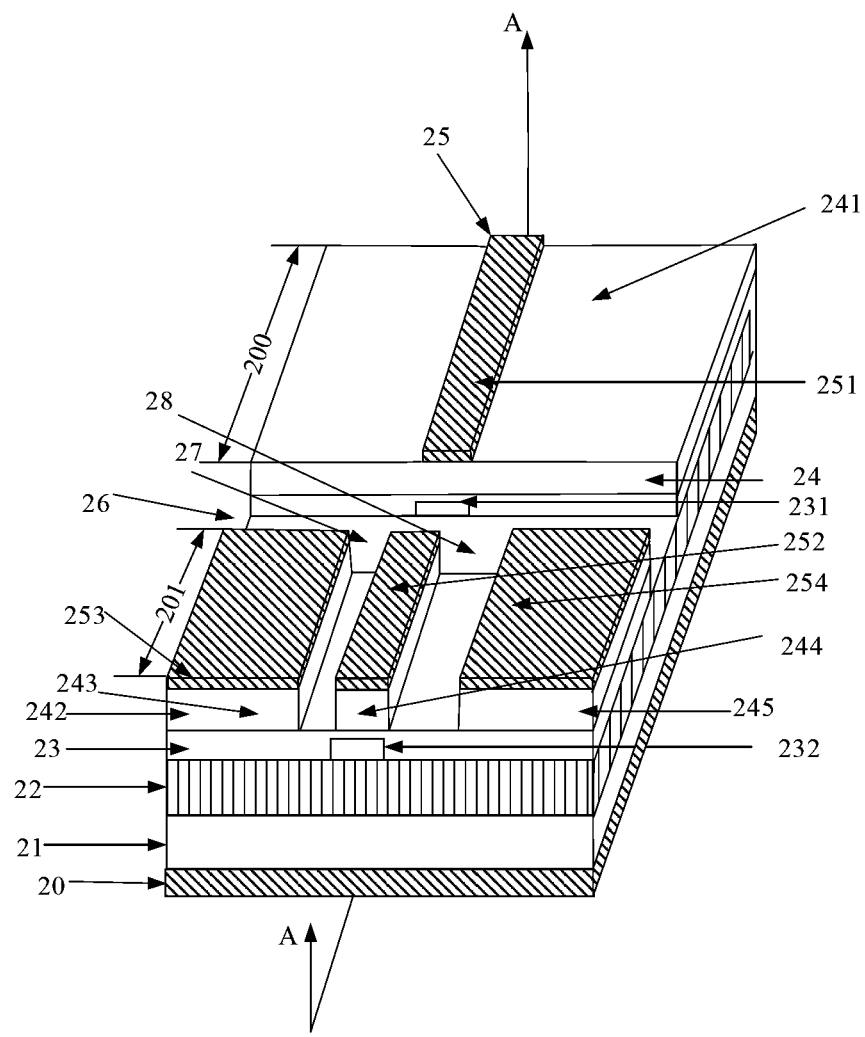
FIG. 2 is a schematic structural diagram of a distributed feedback laser according to an embodiment.

The embodiment of the present invention further provides a specific schematic structural diagram of a laser; as shown in FIG. 2, the schematic structural diagram of the laser is described in detail by taking the DFB laser as an example; the embodiment of the present invention may further be applied to other types of lasers; and lasers that meet the following structural characteristics all fall within the protection scope of the embodiments of this application; the DFB laser includes:

a ground electrode layer 20 located at the bottom of the DFB laser, and a semiconductor substrate 21, an active layer 22, a grating layer 23, an upper covering layer 24 and an electrode layer 25 that are disposed on the ground electrode layer 20 in sequence; the DFB laser further includes a first electrical isolation layer 26, where the first electrical isolation layer 26 includes the first electrical isolation layer 26, and the first electrical isolation layer divides the laser into a laser region 200 and a grating adjustment region 201.

The laser region 200 is configured to generate optical signals, where the optical signals include an optical signal with a wavelength corresponding to a "0" signal and an optical signal with a wavelength corresponding to a "1" signal.

The grating adjustment region 201 is configured to adjust a wavelength of the grating adjustment region by controlling current of the grating adjustment region, so that the optical signal with the wavelength corresponding to the "1" signal of the laser region passes through the grating adjustment region, and the optical signal with the wavelength corresponding to the "0" signal of the laser region returns to the laser region.

Further, the laser region 200 includes: a first current generating unit and a first optical signal generating unit, where the first current generating unit includes: a first electrode sub-layer 251 and the ground electrode 20; first current is generated according to a potential difference between the first electrode sub-layer 251 and the ground electrode 20.

The first optical signal generating unit includes a first grating 231 which is disposed on the first active layer 22 and is located between the first electrode sub-layer 251 and the ground electrode 20; the first current generated by the first current generating unit passes through the first grating 231 and the first active layer 22 to generate the optical signals, where the optical signals include the optical signal with the wavelength corresponding to the "0" signal and the optical signal with the wavelength corresponding to the"1" signal.

The active layer 22 is generally made up of an InGaAsP quaternary compound, and definitely, other materials may also be adopted, such as InGaAlAs, according to a need. The active layer may be a body material, may also contain quantum well structure, and is served as a gain medium of the laser.

The first grating 231 and a second sub-grating 232 is obtained by dividing the grating layer 23, and in the grating layer. Therefore, the first sub-grating 231 and the second sub-grating 232 are the same in material and structure; the grating layer 23 may be made up of an InGaAsP quaternary compound, and also may be made up of other materials, such as InGaAlAs, and may be undoping, and also may be p-type doping. The first sub-grating layer 231 is configured to select a wavelength and generate single-wavelength output; while the second sub-grating layer 232 is configured to suppress chirp generated by direct modulation, enable a needed light wave to pass through, which achieves a filtering effect.

The metal electrode layer 25 is conductive metal, and the upper covering layer 24 is a p-type doping InP pole layer. Between the metal electrode layer 25 and the upper covering layer 24, there is usually a heavily doping InGaAs layer configured to implement ohmic contact.

The electrode layer 25, the upper covering layer 24 and the grating layer 23 in the DFB laser are isolated into two parts by the first electrical isolation layer 26 of this embodiment, to form the laser region 200 and the grating adjustment region 201, so as to avoid mutual influence between the two. A region corresponding to the first electrode sub-layer 251 becomes the laser region 200, and a region corresponding to a second electrode sub-layer 252 becomes the grating adjustment region 201.

Specifically, the laser region 200 is configured to generate laser; specifically, a wavelength control method of the laser region 200 is that: The current is injected from the first electrode sub-layer 251, and then passes through a first upper covering layer 241, the first sub-grating layer 231, the active layer 22 and the semiconductor substrate 21 to reach the ground electrode 20, thereby generating lasing. The grating adjustment region 201 is configured to align with the wavelength corresponding to the "0" signal in the laser generated by the laser region (that is, the optical signal with the wavelength corresponding to the "1" signal in the laser generated by the laser region passes through the grating adjustment region 201, while the optical signal with the wavelength corresponding to the "0" signal in the laser generated by the laser region cannot pass through the grating adjustment region 201).

The grating adjustment region includes: a second current generating unit and a first optical signal processing unit; where the second current generating unit includes: the second electrode sub-layer 252 and a first side electrode layer 253 and a second side electrode layer 254 which are disposed at two sides of the second electrode sub-layer 252; a potential difference between the second electrode sub-layer 252 and the first side electrode layer 253 generates first current, while a potential difference between the second electrode sub-layer 252 and the second side electrode layer 254 generates second current; and the first optical signal processing unit includes: the second grating 232 disposed on a second active layer 22 (the first active layer is the same as the second active layer, that is, the second active layer shares the first active layer); a central wavelength of the second grating 232 is adjusted by controlling the first current and the second current that pass through the second grating and are generated by the second current generating unit, so that the optical signal with the wavelength corresponding to the "1" signal of the laser region passes through the second grating; and the optical signal with the wavelength corresponding to the "0" signal of the laser region returns to the laser region.

Specifically, a wavelength control method of the grating adjustment region 201 is that: The current of the grating adjustment region injected from the second electrode sub-layer 252 passes through the second sub-grating layer 232, and adjusts the wavelength of the second sub-grating layer 232 to align with the wavelength corresponding to the "0" signal.

Further, after the current entering the grating adjustment region passes through the second sub-grating layer 232, it is ensured that alignment between the wavelength of the second sub-grating layer 232 and the wavelength corresponding to the "0" signal can be implemented (that is, the optical signal with the wavelength corresponding to the "0" signal is returned to the laser region, and does not pass through the grating adjustment region, while the optical signal with the wavelength corresponding to the "1" signal passes through the grating adjustment region), and that no lasing generates. The first side electrode layer 253 and the second side electrode layer 254 are disposed on the two sides of the second electrode sub-layer 252, respectively, a second electrical isolation layer 27 is disposed between the first side electrode layer 253 and the second electrode sub-layer 252, and a third electrical isolation layer 28 is disposed between the second side electrode layer 254 and the second electrode sub-layer 252, and a second upper cover layer 242 is divided into a first side upper covering layer 243, a central upper covering layer 244 and a second side upper covering layer 245 by the second electrical isolation layer 27 and the third electrical isolation layer 28, so that current may enter the central upper covering layer 244 from the second electrode 252, flow through the second sub-grating layer 232 region to change the wavelength of the grating, and then enter the first side electrode 253 and the second side electrode 254 through the first side upper covering layer 243 and the second side upper covering layer 245. For example, the second upper covering layer 242 may be directly etched through in a manner of etching, so that the current reaches the second sub-grating layer 232, and then enters the first side electrode 253 and the second side electrode 254 through the first side upper covering layer 243 and the second side upper covering layer 245; and the injected current only passes through the grating region, but not enters in the active layer 22 below the grating. A p-i-p heterojunction structure is formed between the second sub-electrode layer 252 and the first side electrode layer 253 and between the second sub-electrode layer 252 and the second side electrode layer 254, therefore, the current may enter the central upper covering layer 244 from the second electrode 252, and flow through the second sub-grating layer 232 to change the wavelength of the grating, and then enter the first side electrode 253 and the second side electrode 254 through the first side upper covering layer 243 and the second side upper covering layer 245.

Figure 3:
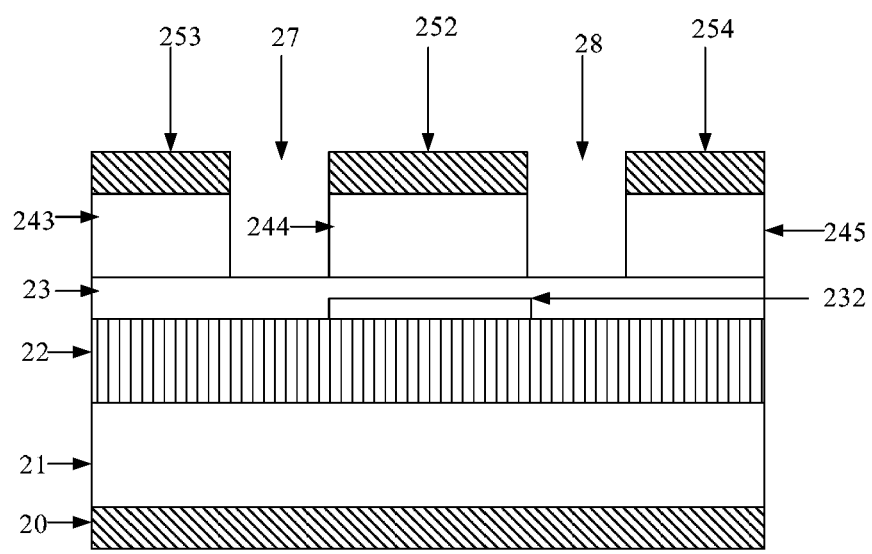
FIG. 3 is a front view of the schematic structural diagram 1 of the distributed feedback laser according to an embodiment.

Referring to FIG. 3, specifically, for the grating adjustment region 201, the second sub-grating layer 232 is the same as the first sub-grating layer 231 in structure in the grating adjustment region 201, but because voltage or current exerted on the first electrode sub-layer 251 and the second electrode sub-layer 252 is different, potency of current carriers entering the gratings of the first sub-grating layer 231 and the second sub-grating layer 232 are different, thereby generating different central wavelengths. Current larger than a threshold needs to be injected into the laser region, so that the laser may perform lasing normally, and a lasing wavelength is consistent with a central wavelength of the first sub-grating layer 231 under corresponding current density. In the grating adjustment region, it is needed to prevent the current injection from generating lasing; and in order to ensure that the grating adjustment region can perform filtering work normally, a specific measure is needed, which may limit the current in a grating structure region to change a central wavelength of the grating structure region without entering in the active layer 22 to generate lasing. Therefore, the electrode layer 25 and the second upper covering layer 242 below the electrode layer 25 are divided into the first side upper covering layer 243, the central upper covering layer 244 and the second side upper covering layer 245, respectively, by using the second electrical isolation layer 27 and the third electrical isolation layer 28; and the two sides of the second electrode layer 252 are provided with the first side electrode layer 253 and the second side electrode layer 254, respectively. Voltage of the first side electrode layer 253 is the same as that of the second side electrode layer 254, and both is smaller than that of the second electrode sub-layer 252; a specific light wave control method is that: Current flows through the central upper covering layer 244 and the second sub-grating layer 232 from the second electrode sub-layer 252, separately enters the first side upper covering layer 243 and the second side upper covering layer 245, and then reaches the first side electrode layer 253 and the second side electrode layer 254. The current flowing through the second sub-grating layer 232 forms current density that is high enough to adjust the wavelength of the second sub-grating layer 232, but at the same time, limits density of current entering the active layer 22, so that the lasing does not occur.

Optionally, in order not to form too strong current between the second electrode sub-layer 252 and the ground electrode layer 20 which is at the bottom of a chip, where the too strong current generates unnecessary lasing, voltage smaller than that of the second electrode sub-layer 252 may be exerted on both the first side electrode layer 253 and the second side electrode 254, so that the potential differences are generated both between the second electrode sub-layer 252 and the first side electrode layer 253 and between the second electrode sub-layer 252 and the second side electrode layer 254, so as to control magnitude of the current passing through the second sub-grating layer 232 and adjust the wavelength of the second sub-grating layer 232 to align with the wavelength corresponding to the "0" signal.

Preferably, the voltage of the first side electrode layer 253 and of the second side electrode layer 254 may further be set to negative values at the same time, and the voltage on the second electrode sub-layer 252 may be set to 0.

It should be noted that, in the embodiment of the present invention, the first electrical isolation layer 26 or the second electrical isolation layer 27 or the third electrical isolation layer 28 may use air, photo-resist and aluminum oxide, but is not limited to these, and other insulating mediums are also available.

By performing adjustment on structure of the distributed feedback laser, the distributed feedback laser provided in the embodiment of the present invention ensures that the wavelength of the grating in a optical filter is aligned with the wavelength corresponding to the "0" signal, but does not generate lasing itself, which implements suppression of the feedback laser to the chirp and increases a transmission distance. At the same time, a manufacturing process of the distributed feedback laser is not changed, so that the manufacturing process is not increased while the distributed feedback laser implements filtering.

Embodiment 3

Figure 4:
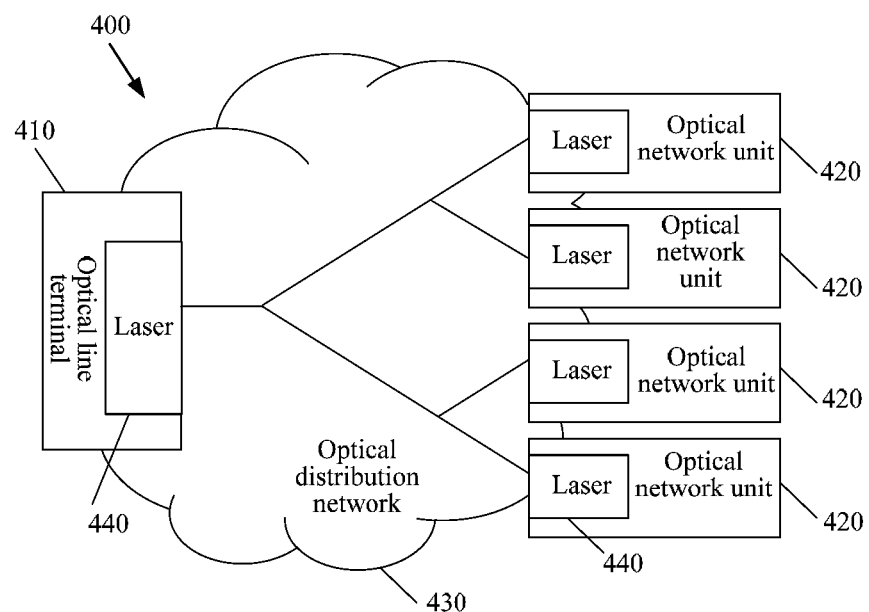
FIG. 4 is a diagram of a passive optical network system of a distributed feedback laser according to an embodiment.

As shown in FIG. 4, the embodiment of the present invention further provides a passive optical network system 400, including: an optical line terminal 410 and multiple optical network units 420, where the optical line terminal 410 is connected to the multiple optical network units 420 through an optical distribution network 430, and the optical network unit 420 and/or the optical line terminal 410 includes a laser 440; the laser 440 includes: a laser region and a grating adjustment region; reference may be made to the structure of the laser described in FIG. 1 and Embodiment 1 for specific structure of the laser 440.

In addition, the embodiment of the present invention further provides an optical network equipment, which also includes the structure of the laser as described in Embodiment 1 and FIG. 1; and the structure of the laser is described again in the following with reference to FIG. 1.

Referring to FIG. 1, the laser is divided into a laser region and a grating adjustment region through a first electrical isolation layer.

The laser region is configured to generate optical signals, where the optical signals include an optical signal with a wavelength corresponding to a "0" signal and an optical signal with a wavelength corresponding to a "1" signal;

The grating adjustment region is configured to adjust a wavelength of the grating adjustment region by controlling current of the grating adjustment region, so that the optical signal with the wavelength corresponding to the "1" signal of the laser region passes through the grating adjustment region, and the optical signal with the wavelength corresponding to the "0" signal of the laser region returns to the laser region.

Further, the laser region includes: a first current generating unit and a first optical signal generating unit, where the first current generating unit includes: a first electrode sub-layer and a ground electrode; and first current is generated according to a potential difference between the first electrode sub-layer and the ground electrode.

The first optical signal generating unit includes a first grating that is disposed on a first active layer and is located between the first electrode sub-layer and the ground electrode; the first current generated by the first current generating unit passes through the first grating and the first active layer to generate the optical signals, where the optical signals include the optical signal with the wavelength corresponding to the "0" signal and the optical signal with the wavelength corresponding to the "1" signal.

The grating adjustment region includes: a second current generating unit and a first optical signal processing unit, where the second current generating unit includes: a second electrode sub-layer and a first side electrode layer and a second side electrode layer which are disposed at two sides of the second electrode sub-layer; a potential difference between the second electrode sub-layer and the first side electrode layer generates first current, while a potential difference between the second electrode sub-layer and the second side electrode layer generates second current; and the first optical signal processing unit includes: a second grating disposed on a second active layer (the first active layer is the same as the second active layer, that is, the second active layer shares the first active layer); a central wavelength of the second grating 232 is adjusted by controlling the first current and the second current that pass through the second grating unit and are generated by the second current generating unit, so that the optical signal with the wavelength corresponding to the "1" signal of the laser region passes through the second grating; and the optical signal with the wavelength corresponding to the "0" signal of the laser region returns to the laser region.

Further, the second current generating unit is specifically configured to, when voltage exerted on the first side electrode layer and voltage exerted on the second side electrode layer are both smaller than voltage exerted on the second electrode sub-layer, enable potential differences to be generated both between the second electrode sub-layer and the first side electrode layer and between the second electrode sub-layer and the second side electrode layer.

Further, the second current generating unit is specifically configured to, when voltage exerted on the first side electrode layer and voltage exerted on the second side electrode layer are both negative values, and voltage exerted on the second electrode sub-layer is 0, enable potential differences to be generated both between the second electrode sub-layer and the first side electrode layer and between the second electrode sub-layer and the second side electrode layer.

The first current signal processing unit may control the voltage of the first side electrode layer, the voltage of the second side electrode layer and the voltage of the second electrode sub-layer, so that the current does not enter the first active layer after passing through the second grating, that is, the current flows through the second grating but does not generate laser, and may adjust the current that passes through second grating, so that the optical signal with the wavelength corresponding to the "1" signal, where the optical signal is generated by the laser region, passes through the grating adjustment region, while the optical signal with the wavelength corresponding to the "0" signal, where the optical signal is generated by the laser region, returns to the laser region.

The passive optical network system and the optical network equipment provided in the embodiment of the present invention, where the optical network unit or the optical line terminal in the optical network system includes a laser and the optical network equipment also includes the laser, by performing adjustment on structure of the laser, ensure that the wavelength of the grating in the laser is aligned with the wavelength corresponding to the "0" signal, that is, to make the optical signal with the wavelength corresponding to the "0" signal be returned, and allow the optical signal with the wavelength corresponding to the "1" signal to pass through, but do not generate lasing themselves, which implements suppression of the feedback laser to chirp and increases a transmission distance of the passive optical network system.

Embodiment 4

This embodiment further provides a wavelength control method of a laser, where the laser includes: a laser region and a grating adjustment region; the laser is divided into the laser region and the grating adjustment region through a first electrical isolation layer; and the method includes:

generating, by the laser region, an optical signal with a wavelength corresponding to a "0" signal and an optical signal with a wavelength corresponding to a "1" signal; and adjusting, by the grating adjustment region, a wavelength of the grating adjustment region by controlling current of the grating adjustment region, returning the optical signal with the wavelength corresponding to the "0" signal of the laser region, and allowing the optical signal with the wavelength corresponding to the "1" signal of the laser region to pass through.

According to the wavelength control method of the laser provided in the embodiment of the present invention, by controlling voltage exerted on the laser, it is ensured that the wavelength of the grating in the laser is aligned with the wavelength corresponding to the "0" signal, but no lasing is generated itself, which implements suppression of the feedback laser to chirp and increases a transmission distance. At the same time, a manufacturing process of the distributed feedback laser is not changed, so that the manufacturing process is not increased while the laser implements filtering.

Further, the laser region includes: a first current generating unit and a first optical signal generating unit, where the first current generating unit includes: a first electrode sub-layer and a ground electrode; and first current is generated according to a potential difference between the first electrode sub-layer and the ground electrode.

The first optical signal generating unit includes a first grating that is disposed on a first active layer and is located between the first electrode sub-layer and the ground electrode; the first current generated by the first current generating unit passes through the first grating and the first active layer to generate the optical signals, and the optical signals include the optical signal with the wavelength corresponding to the "0" signal and the optical signal with the wavelength corresponding to the"1" signal.

The grating adjustment region includes: a second current generating unit and a first optical signal processing unit, where the second current generating unit includes: a second electrode sub-layer and a first side electrode layer and a second side electrode layer which are disposed at two sides of the second electrode sub-layer; a potential difference between the second electrode sub-layer and the first side electrode layer generates first current, while a potential difference between the second electrode sub-layer and the second side electrode layer generates second current; and the first optical signal processing unit includes: a second grating disposed on a second active layer; a central wavelength of the second grating is adjusted by controlling the first current and the second current that pass through the second grating and are generated by the second current generating unit, so that the optical signal with the wavelength corresponding to the "1" signal of the laser region passes through the second grating; and the optical signal with the wavelength corresponding to the "0" signal of the laser region returns to the laser region.

The second current generating unit is specifically configured to, when voltage exerted on the first side electrode layer and voltage exerted on the second side electrode layer are both smaller than voltage exerted on the second electrode sub-layer, enable potential differences to be generated both between the second electrode sub-layer and the first side electrode layer and between the second electrode sub-layer and the second side electrode layer.

Further, the second current generating unit is specifically configured to, when voltage exerted on the first side electrode layer and voltage exerted on the second side electrode layer are both negative values, and voltage exerted on the second electrode sub-layer is 0, enable potential differences to be generated both between the second electrode sub-layer and the first side electrode layer and between the second electrode sub-layer and the second side electrode layer.

According to the wavelength control method of the laser provided in the embodiment of the present invention, by performing adjustment on structure of the laser, it is ensured that the wavelength of the grating in the laser is aligned with the wavelength corresponding to the "0" signal, that is, to make the optical signal with the wavelength corresponding to the "0" signal be returned, and allow the optical signal with the wavelength corresponding to the "1" signal to pass through, but no lasing is generated itself, which implements suppression of the feedback laser to chirp and increases a transmission distance of a passive optical network system.

The foregoing descriptions are merely specific embodiments of the present invention, but the protection scope of the present invention is not limited here. Any variation or replacement that may be easily thought of by persons skilled in the art without departing from the technical scope disclosed in the present invention shall fall within the protection scope of the present invention. Therefore, the protection scope of the present invention shall be subject to the claims.

What is claimed is:

1. A laser, wherein the laser comprises: a laser region and a grating adjustment region; wherein the laser is divided into the laser region and the grating adjustment region by a first electrical isolation layer;
   the laser region is configured to generate optical signals, wherein the optical signals comprise an optical signal with a wavelength corresponding to a "0" signal and an optical signal with a wavelength corresponding to a "1" signal; and
   the grating adjustment region is configured to adjust a wavelength of the grating adjustment region by controlling current of the grating adjustment region, so that the optical signal with the wavelength corresponding to the "1" signal of the laser region passes through the grating adjustment region, and the optical signal with the wavelength corresponding to the "0" signal of the laser region returns to the laser region,
   wherein the grating adjustment region comprises: a grating adjustment region current generating unit and a grating adjustment region optical signal processing unit, wherein:
   the grating adjustment region current generating unit comprises: a grating adjustment region electrode sub-layer and a first side electrode layer and a second side electrode layer which are disposed at two sides of the grating adjustment region electrode sub-layer; a potential difference between the grating adjustment region electrode sub-layer and the first side electrode layer generates a first current, while a potential difference between the grating adjustment region electrode sub-layer and the second side electrode layer generates a second current; and
   the grating adjustment region optical signal processing unit comprises: a grating adjustment region grating disposed on an active layer; wherein a central wavelength of the grating adjustment region grating is adjusted by controlling the first current and the second current that pass through the grating adjustment region grating and are generated by the grating adjustment region current generating unit, so that the optical signal with the wavelength corresponding to the "1" signal of the laser region passes through the grating adjustment region grating; and the optical signal with the wavelength corresponding to the "0" signal of the laser region returns to the laser region.

2. The laser according to claim 1, wherein the laser region comprises: a laser region current generating unit and a laser region optical signal generating unit, and the laser region current generating unit comprises: a laser region electrode sub-layer and a ground electrode; wherein a first laser region current is generated according to a potential difference between the laser region electrode sub-layer and the ground electrode;
   the laser region optical signal generating unit comprises a laser region grating that is disposed on another active layer and is located between the laser region electrode sub-layer and the ground electrode; the first laser region current generated by the laser region current generating unit passes through the laser region grating and the another active layer to generate the optical signals, wherein the optical signals comprise the optical signal with the wavelength corresponding to the "0" signal and the optical signal with the wavelength corresponding to the "1" signal.

3. The laser according to claim 1, wherein the grating adjustment region current generating unit is configured to, when a voltage exerted on the first side electrode layer and a voltage exerted on the second side electrode layer are both smaller than a voltage exerted on the grating adjustment region electrode sub-layer, enable potential differences to be generated both between the grating adjustment region electrode sub-layer and the first side electrode layer and between the grating adjustment region electrode sub-layer and the second side electrode layer.

4. The laser according to claim 1, wherein the grating adjustment region current generating unit is configured to, when a voltage exerted on the first side electrode layer and a voltage exerted on the second side electrode layer are both negative values, and a voltage exerted on the grating adjustment region electrode sub-layer is 0, enable potential differences to be generated both between the grating adjustment region electrode sub-layer and the first side electrode layer and between the grating adjustment region electrode sub-layer and the second side electrode layer.

5. A passive optical network system, comprising: an optical line terminal and multiple optical network units, wherein the optical line terminal is connected to the multiple optical network units through an optical distribution network, the optical network unit or the optical line terminal comprises a laser, and the laser comprises: a laser region and a grating adjustment region; wherein the laser is divided into the laser region and the grating adjustment region by a first electrical isolation layer;
   the laser region is configured to generate optical signals, wherein the optical signals comprise an optical signal with a wavelength corresponding to a "0" signal and an optical signal with a wavelength corresponding to a "1" signal; and
   the grating adjustment region is configured to adjust a wavelength of the grating adjustment region by controlling current of the grating adjustment region, so that the optical signal with the wavelength corresponding to the "1" signal of the laser region passes through the grating adjustment region, and the optical signal with the wavelength corresponding to the "0" signal of the laser region returns to the laser region,
   wherein the grating adjustment region comprises: a grating adjustment region current generating unit and a grating adjustment region optical signal processing unit, wherein:
   the grating adjustment region current generating unit comprises: a grating adjustment region electrode sub-layer and a first side electrode layer and a second side electrode layer which are disposed at two sides of the grating adjustment region electrode sub-layer; a potential difference between the grating adjustment region electrode sub-layer and the first side electrode layer generates a first current, and a potential difference between the grating adjustment region electrode sub-layer and the second side electrode layer generates a second current; and
   the grating adjustment region optical signal processing unit comprises: a grating adjustment region grating disposed on an active layer; a central wavelength of the grating adjustment region grating is adjusted by controlling the first current and the second current that pass through the grating adjustment region grating and are generated by the grating adjustment region current generating unit, so that the optical signal with the wavelength corresponding to the "1" signal of the laser region passes through the grating adjustment region grating; and the optical signal with the wavelength corresponding to the "0" signal of the laser region returns to the laser region.

6. The passive optical network system according to claim 5, wherein the laser region comprises: a laser region current generating unit and a laser region optical signal generating unit, and the laser region current generating unit comprises: a laser region electrode sub-layer and a ground electrode; wherein a first laser region current is generated according to a potential difference between the laser region electrode sub-layer and the ground electrode; and the laser region optical signal generating unit comprises a laser region grating that is disposed on another active layer and is located between the laser region electrode sub-layer and the ground electrode; the first laser region current generated by the laser region current generating unit passes through the laser region grating and the another active layer to generate the optical signals, and the optical signals comprise the optical signal with the wavelength corresponding to the "0" signal and the optical signal with the wavelength corresponding to the "1" signal.

7. The passive optical network system according to claim 5, wherein the grating adjustment region current generating unit is configured to, when a voltage exerted on the first side electrode layer and a voltage exerted on the second side electrode layer are both smaller than a voltage exerted on the grating adjustment region electrode sub-layer, enable potential differences to be generated both between the grating adjustment region electrode sub-layer and the first side electrode layer and between the grating adjustment region electrode sub-layer and the second side electrode layer.

8. The laser according to claim 5, wherein the grating adjustment region current generating unit is configured to, when a voltage exerted on the first side electrode layer and a voltage exerted on the second side electrode layer are both negative values, and a voltage exerted on the grating adjustment region electrode sub-layer is 0, enable potential differences to be generated both between the grating adjustment region electrode sub-layer and the first side electrode layer and between the grating adjustment region electrode sub-layer and the second side electrode layer.

9. An optical network equipment, comprising the laser according to claim 1.

10. A wavelength control method of a laser, wherein the laser comprises: a laser region and a grating adjustment region, the laser is divided into the laser region and the grating adjustment region by a first electrical isolation layer the grating adjustment region comprises a grating adjustment region current generating unit and a grating adjustment region optical signal processing unit, and the method comprises:

generating, by the laser region, an optical signal with a wavelength corresponding to a "0" signal and an optical signal with a wavelength corresponding to a "1" signal;

adjusting, by the grating adjustment region, a wavelength of the grating adjustment region by controlling current of the grating adjustment region, so that the optical signal with the wavelength corresponding to the "0" signal of the laser region returns to the laser region, and so that the optical signal with the wavelength corresponding to the "1" signal of the laser region passes through the grating adjustment region;

generating, by the grating adjustment region current generating unit, a first current and a second current, wherein the grating adjustment region optical signal processing unit comprises a grating adjustment region grating, and the method further comprises adjusting by controlling the first current and the second current that pass through the grating adjustment region grating so that the optical signal with the wavelength corresponding to the "1" signal of the laser region passes through the grating adjustment region grating and the optical signal with the wavelength corresponding to the "0" signal of the laser region returns to the laser region.

* * * * *